United States Patent [19]

McComas

[11] 4,203,148

[45] May 13, 1980

[54] INDICATOR AND CONTROL DEVICE FOR PC BOARDS

[76] Inventor: Ralph J. McComas, P.O. Box 113, Boulder Creek, Calif. 95006

[21] Appl. No.: 894,714

[22] Filed: Apr. 10, 1978

[51] Int. Cl.$^2$ .............................................. H02B 1/02
[52] U.S. Cl. ..................................... 361/399; 361/415
[58] Field of Search ................. 361/399, 396, 415; 339/110 R, 110 P, 113 R, 113 B, 113 L, 17 R; 250/239; 16/110 R, 114 A; 248/27.1

[56] References Cited

U.S. PATENT DOCUMENTS

| | | | |
|---|---|---|---|
| 3,344,243 | 9/1967 | De Vries | 361/415 |
| 3,398,290 | 8/1968 | Basehore et al. | 250/239 |
| 3,573,358 | 4/1971 | Babcock | 361/399 |
| 3,710,194 | 1/1973 | Zammit et al. | 361/415 |
| 3,755,630 | 8/1973 | Boyer | 361/415 |
| 3,919,738 | 11/1975 | Schmall | 16/110 R |
| 4,079,438 | 3/1978 | Schmall | 361/399 |
| 4,097,894 | 6/1978 | Tanner et al. | 361/399 |

Primary Examiner—David Smith, Jr.
Attorney, Agent, or Firm—Claude A. S. Hamrick

[57] ABSTRACT

An indicator and control device that can be directly mounted upon a printed circuit board or the like and which is for supporting switches and indicators that are hard-wired to the circuit board, the indicator device including a component-mounting plate to which the switches and indicators are attached, and a pair of insulating standoff members attached to a rearward surface of the mounting plate that are provided with slots receptive to an edge of a circuit board.

6 Claims, 10 Drawing Figures

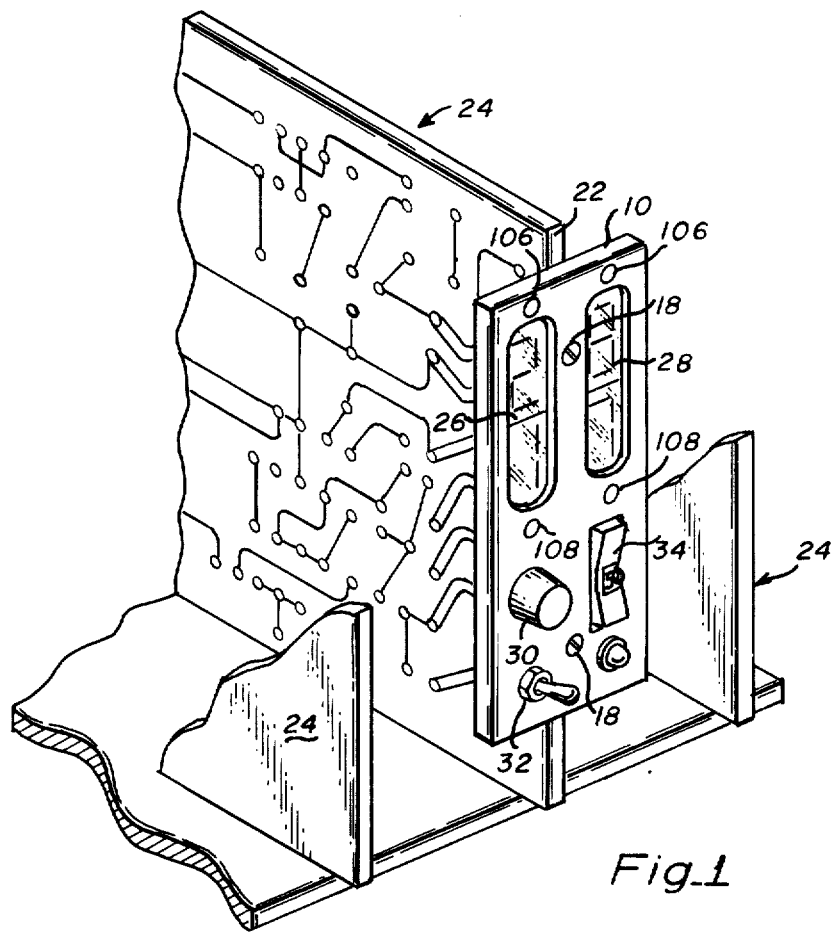
Fig_1
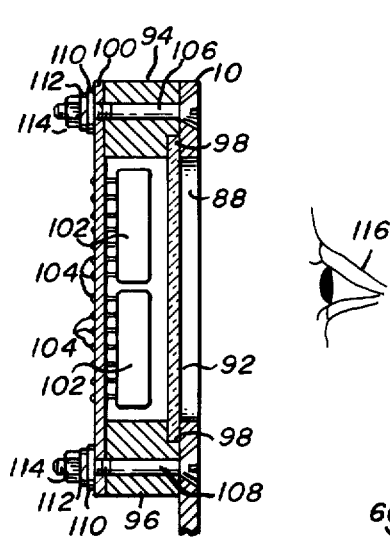
Fig_2a
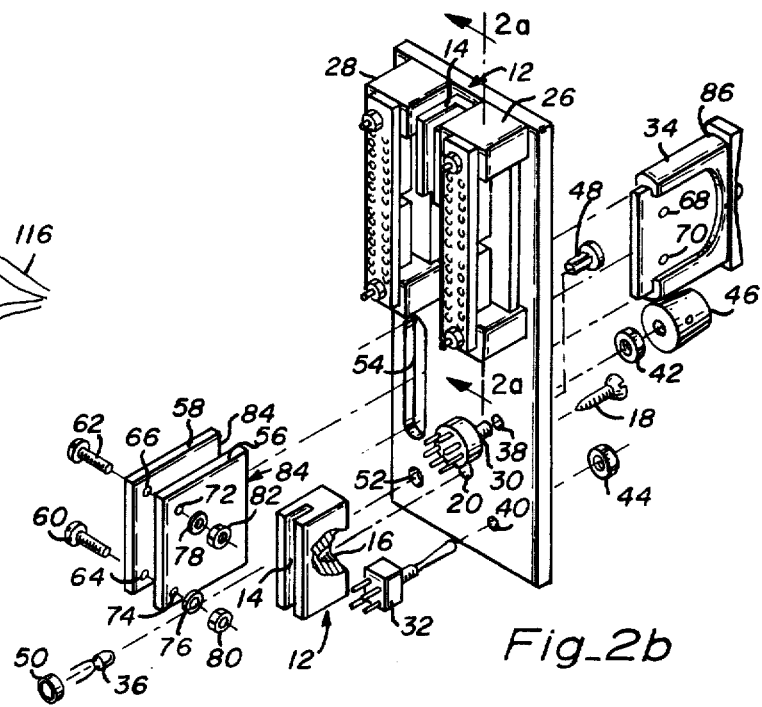
Fig_2b

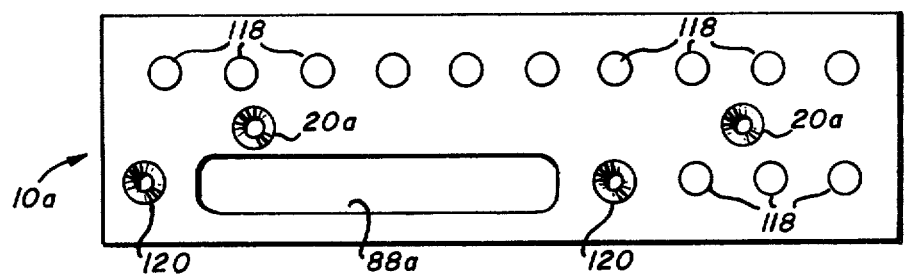
Fig_3a
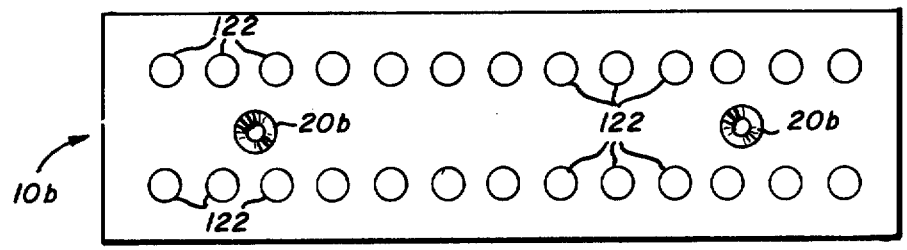
Fig_3b
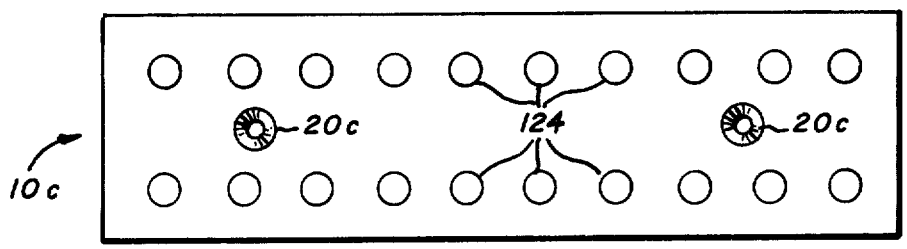
Fig_3c
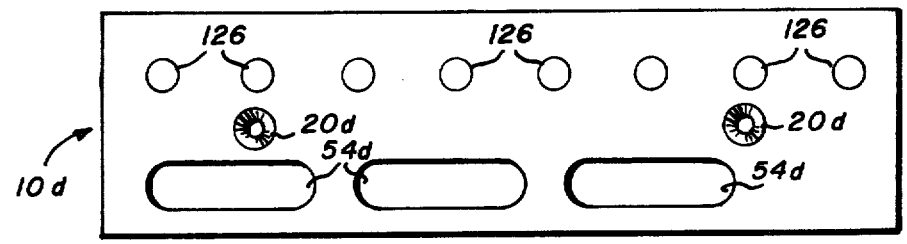
Fig_3d
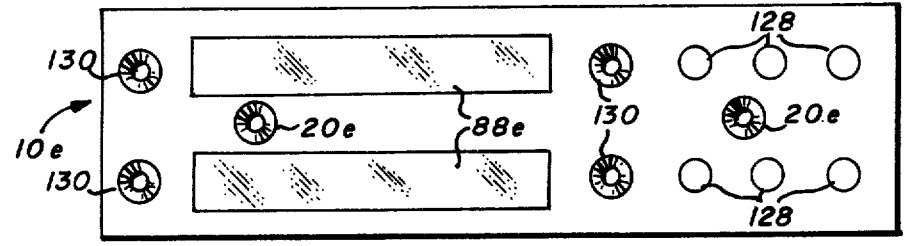
Fig_3e
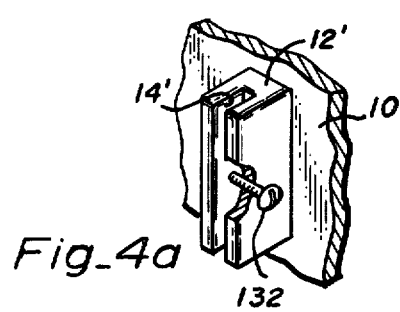
Fig_4a
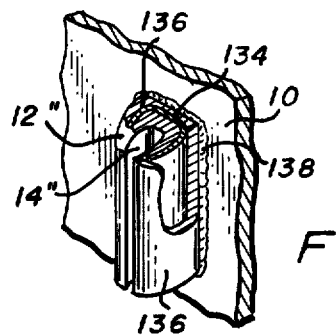
Fig_4b

INDICATOR AND CONTROL DEVICE FOR PC BOARDS

BACKGROUND OF THE INVENTION

1. Field of the Invention

This device relates generally to electric indicator and control devices and more particularly to indicator and control devices that can be retro-fitted or added onto a circuit board.

2. Description of the Prior Art

Complex electronic apparatus typically have their circuitry constructed in small subcircuit modules so that, should the apparatus break down, it is easier to fix. A preferred method for modulizing an electronic circuit is to form each subcircuit on a plug-in "card" which has printed circuit traces formed along one edge which touch contacts within a card-receiving connector attached to a mother board of the electronic apparatus.

These cards allow a repair technician to unplug a defective subcircuit card from the mother board and substitute a working subcircuit card for it, if he can figure out which card is defective. The problem is that in most electronic apparatus, cards are arranged in closely packed, space-saving rows. Unfortunately for the repairing technician, these closely packed cards are virtually impossible to test while still plugged into the mother board. In consequence, a technician must remove a card from the electronic apparatus in order to test it, which presents yet another problem; namely, that it is much more difficult to test a removed subcircuit card than it is to test it in situ.

Frank Draper Babcock partially addressed this problem in U.S. Pat. No. 3,573,558 in which he disclosed a printed circuit handle having a slot with a number of contacts positioned therein for making electrical connections with traces formed on an edge of a printed circuit card. Lights and switches were disposed within recesses formed on the front of the handle and were electrically connected to the contacts of the slot. The lights of Babcock's invention could be used to display potentials at several locations in the subcircuit and the switches could be wired to interact with the card's subcircuit in various ways. A circuit board outfitted with Babcock's handle can be tested to a limited degree and even functionally modified without being removed from the mother board of the electronic apparatus.

Drawbacks of Babcock's invention include that it is a special purpose device which can only be used with a printed circuit board specifically designed for his handle and that it is an expensive device due to its relative mechanical complexity. Also, the switches and indicators of Babcock's invention are nonstandard and must be manufactured solely for their use in his PC board handle device.

SUMMARY OF THE PRESENT INVENTION

In view of the above discussion of the prior art, it should be apparent that a major objective of this invention is to provide an indicator and control device that can be mounted on virtually any PC or wire-wrap circuit board card.

It is another object of this invention to provide the aforementioned object economically and with a minimum of labor intensive operations.

Briefly, my indicator and control device includes a component-mounting plate having a front and rear surface and provided with at least one aperture through which an electric component such as a switch or an indicator is disposed, and at least one insulating standoff member attached to the rear surface of the mounting plate and having a slot for receiving and securing an edge of a printed circuit or wire-wrapped circuit card.

An advantage of my indicator and control device is that the mounting plate and the standoff are cheap and simple to produce and that different sizes, styles and patterns of apertures can be formed in the plate to accommodate a great variety of indicators, switches and the like.

These and other objects and advantages of my invention will become clear to the reader after studying the following detailed description and the several figures of the drawing.

IN THE DRAWING

FIG. 1 is a perspective view of my indicator and control device connected to a printed circuit board card;

FIG. 2 is an exploded rear perspective view of the indicator and control device shown in FIG. 1;

FIG. 2a is a cross-sectional view taken along line 2—2a of FIG. 2;

FIG. 3a–3e illustrate alternate embodiments for the mounting plate of the indicator and control device shown in FIG. 1; and FIGS. 4a and 4b illustrate alternate embodiments for the stand-off member of the indicator and control device illustrated in FIG. 1.

DETAILED DESCRIPTION OF THE PREFERRED EMBODIMENT

Referring to FIGS. 1 and 2 of the drawing, my indicator and control device for PC boards and the like is shown to include a component-mounting plate 10 and a pair of insulating standoff members 12. Mounting plate 10 is a thin, rectangular plate of aluminum having a number of holes or apertures formed through it through which switches, lights, and indicators can be disposed as shown.

Stand off members 12 (seen in FIG. 2) are rectangular blocks of an insulating material such as phenolic. Formed on one side of stand off member 12 is a groove 14 and formed from an opposing side is a threaded bolt hole 16. In this preferred embodiment, a bolt 18 is disposed through a hole 20 in the mounting plate to engage with bolt hole 16 and to firmly hold the standoff member against the back surface of the component-mounting plate.

As seen in FIG. 1, my indicator and control device is attached to an edge 22 of one of a plurality of subcircuit cards 24 that are plugged into a mother board (not seen). Slots 14 of the stand off members slip over edge 22 of the card. The slots are designed to be only slightly wider than the width of the card so that a slight amount of frictional engagement occurs. The stand off members can be glued to the board by means of a suitable adhesive, such as eposy.

The various components shown on mounting plate 10 include a pair of seven-segment assemblies 26 and 28, a ten-position switch 30, a SPDT switch 32, a ten-position thumb-wheel switch 34, and an LED indicator light 36.

Switches 30 and 32 are mounted from the rear surface of the mounting plate by disposing their shafts through holes 38 and 40, respectively, and are retained in position by respective nuts 42 and 44. Ten-position switch 30 has a knob 46 disposed over the end of its shaft.

LED indicating light 36 is attached to mounting plate 10 by means of LED mounting members 48 and 50. LED mounting member 48 has a flanged front portion and a split tubular portion extending rearwardly therefrom. The tubular portion of member 48 is disposed through a hole 52 from the front of mounting plate 10. LED 36 is inserted into member 48 and a closing ring 50 locks the tubular portion of member 48 around the LED to secure it in place.

Thumb-wheel switch 34 is disposed through an elongated slot 54 formed in the mounting plate and is secured in place by a pair of thumb-wheel switch-mounting members 56 and 58. A pair of bolts 60 and 62 extend through holes 64 and 66 of member 58, through holes 68 and 70 of thumb-wheel switch 34, and through holes 72 and 74 of member 56. Respective lock washers 76 and 78 are disposed over the ends of the bolts and nuts 80, and 82 are tightened thereupon. The thumb-wheel switch is held in position since it cannot move forwardly because front edges 84 of members 56 and 58 abut the rear surface of a mounting plate, and it cannot move rearwardly because flange 86 abuts the front surface of the mounting plate.

The construction of the seven-segment assembly 26 (and the identical seven-segment assembly 28) can best be seen in FIG. 2a, which is a cross section along line 2a—2a of FIG. 2. An elongated aperture 88 is formed in mounting plate 10 and a colored viewed plate 92 is secured against the back surface of the mounting plate by a pair of mounting blocks 94 and 96. The viewing plate fully covers the aperture and is generally tinted red when red-light emitting, seven-segment devices are used.

Each of blocks 94 and 96 are provided with a groove 98 to engage an end of viewing plate 94 and to press the ends against rear surface of mounting plate 10. Disposed against the rear surfaces of blocks 94 and 96 is a printed circuit (PC) board 100 which supports a pair of seven-segment devices 102 in alignment with view plate 92 and aperture 88. Leads 104 of the seven-segment devices extend through the printed circuit board to contact traces formed thereupon.

The entire seven-segment assembly is held together by a pair of bolts 106 and 108 which extend through apertures in the the mounting plate, respective apertures in mounting blocks 94 and 96, and apertures in PC board 100. Washers 110, lock washers 112 and nuts 114 are disposed over the ends of the respective bolts and tightened thereupon to rigidly bolt the seven-segment assembly together. An eye 116 of a user can view the numerals displayed by seven-segment devices 102 through aperture 88 and view plate 92.

In FIGS. 3a through 3e, a number of different mounting plates that are in accordance with my present invention are shown. In FIG. 3a, mounting plate 10a includes an aperture 88a for a seven-segment assembly and thirteen apertures 118 for switches or indicator lights. Also, a pair of countersunk holes 20a are provided so that standoff members may be attached to the mounting plate by means of suitable bolts, and a pair of countersunk holes 120 are provided for the bolts used to attach a seven-segment assembly to the mounting plate.

In FIGS. 3b and 3c, respective mounting plates 10b and 10c are provided with a plurality of holes 122 and 124, respectively, through which switches or indicator lights may be mounted. Plates 10b and 10c are also provided with countersunk holes 20b and 20c, respectively, so that standoffs may be bolted to the mounting plates.

In FIG. 3d, a mounting plate 10d is provided with three apertures 54d in which thumb-wheel type switches can be mounted. Plate 10d is also provided with eight holes 126 in which indicator lights or switches may be disposed. A pair of countersunk holes 20d are provided to allow for the bolting of the standoffs to the rear surface of plate 10d.

Finally, in FIG. 3e a mounting plate 10e is provided with a pair of elongated apertures 88e for the mounting of three seven-segment assemblies, and with holes 128 in which indicator lights or switches may be disposed. Plate 10e is also provided with a pair of countersunk holes 20e for the bolts attaching the standoff members to the mounting plate and a pair of countersunk holes 130 associated with each of elongated slots 88e for the bolts attaching the seven-segment assemblies to the mounting plate.

Of course, the apertures formed through my mounting plates can assume an almost infinite variety of patterns and shapes. The mounting plates shown in FIGS. 3a through 3e were described for the purposes of illustration and to make it apparent that any number of mounting plate types are possible.

In FIG. 4a, an alternate construction 12' of a standoff member is shown. The construction and attachment of member 12' is virtually identical to that of previously discussed member 12 with the exception that a clamping bolt 132 has been added. The clamping bolt engages a threaded bolt hole formed in the side of stand off member 12' and when screwed therein can extend at least partially across groove 14'. In use, bolt 132 is unscrewed from the bolt hole until its end does not project into groove 14', an edge of a circuit board is inserted into groove 14' and bolt 132 tightened to compressively clamp an edge of the PC board within groove 14'. Since bolt 132 may contact traces on the printed circuit board, it is preferable that this bolt be constructed from a nonconducting material such as nylon.

In FIG. 4b, a second alternate embodiment 12" for a standoff is shown where a closed, U-shaped band spring 134 is encapsulated within a nonconducting material 136. Stand off member 12" is preferably attached to a rear surface of mounting plate 10 with an adhesive 138. The band spring urges groove 14" to close and thus grip the edge of a printed circuit board disposed therein. Band spring 134 is preferably constructed of tempered spring steel, and nonconducting coating 136 can comprise any number of materials including the natural and synthetic rubbers or a flexible thermo-plastic.

Although my invention has been described in the terms of a few preferred embodiments, it is contemplated that various alterations and modifications will become apparent to those skilled in the art after having read the preceding detailed description. For example, the mounting plates described could be formed of an inexpensive injection molded plastic instead of aluminum. It is therefore intended that the appended claims include all such alterations and modifications as fall within the true spirit and scope of my invention.

What is claimed is:

1. An indicator and control device for PC boards and the like comprising:
   an elongated generally rectangular component mounting plate having a front surface a rear surface and a longitudinal axis, said plate being provided with at least one elongated aperture lying parallel to and laterally offset from said longitudinal axis, and at least one other aperture;

an elongated indicator means affixed to said rear surface so as to be viewable through said elongated aperture;

a manually operable electrical component mounted within said other aperture;

at least one insulating standoff member disposed along said longitudinal axis and provided with a slot for receiving an edge of said circuit board; and means attaching said standoff member to the rear surface of said mounting plate, whereby said indicator and control device is attached to said circuit board by lodging an edge of said circuit board within the slot of said standoff member, and by wiring said electrical component to said circuit board.

2. An indicator and control device as recited in claim 1 wherein said standoff member is shaped like a rectangular prism and has opposing front and rear surfaces, whereby said front surface of said standoff member abuts said rear surface of said mounting plate and said slot formed inwardly from said rear surface of said standoff member.

3. An indicator and control device as recited in claim 1 further comprising:

an elongated, transparent view plate disposed against the rear surface of said mounting plate and covering said elongated aperture;

a first mounting block disposed to engage a first end portion of said view plate;

first means for attaching said first mounting block to the rear surface of said mounting plate;

a second mounting block disposed to engage a second end portion of said view plate, and second means for attaching said second mounting block to the rear surface of said mounting plate, whereby said first and said second mounting blocks retain said view plate in position against the rear surface of said mounting plate and over said aperture.

4. An indicator and control device as recited in claim 3 wherein said first and said second mounting blocks are each provided with a slot receptive to respective end portions of said viewing plate.

5. An indicator and control device as recited in claim 3 wherein, said first means for attaching includes a first bolt means disposed through aligned holes formed through said mounting plate and said first mounting block, and a first nut means tightened upon the end of said first bolt means, and said second means for attaching includes a second bolt means disposed through aligned holes formed through said mounting plate and said second mounting block, and a second nut means tightened upon the end of said second bolt means, whereby said first and said second mounting blocks are bolted to said mounting plate and the ends of said view plate are clamped between said mounting blocks and said mounting plate.

6. An indicator and control device as recited in claim 5 further comprising:

an elongated mounting board extending between said first and said second mounting blocks, and wherein said indicator means includes at least one optical display attached to said mounting board, whereby said optical display is visible to a user who is looking through said view plate from the front side of said indicator device.

* * * * *